United States Patent [19]

Mahoney et al.

[11] Patent Number: 4,762,975
[45] Date of Patent: Aug. 9, 1988

[54] METHOD AND APPARATUS FOR MAKING SUBMICROM POWDERS

[75] Inventors: John F. Mahoney, So. Pasadena; Scott D. Taylor, Azusa; Julius Perel, Altadena, all of Calif.

[73] Assignee: Phrasor Scientific, Incorporated, Duarte, Calif.

[21] Appl. No.: 120,679

[22] Filed: Nov. 12, 1987

Related U.S. Application Data

[63] Continuation of Ser. No. 577,073, Feb. 6, 1984, abandoned.

[51] Int. Cl.⁴ .................... B23K 15/00; B05D 1/06
[52] U.S. Cl. ........................ 219/69 R; 219/121.16; 264/10; 427/30
[58] Field of Search ........... 219/69 R, 76.16, 121 PL, 219/121 EE, 121 EF, 121 EG, 383; 204/164; 427/25, 12, 27, 30, 34; 264/10; 75/0.05 B, 0.05 C, 10.11, 10.13; 250/423 R; 313/550, 564, 566

[56] References Cited

U.S. PATENT DOCUMENTS

| | | | |
|---|---|---|---|
| 2,131,204 | 9/1938 | Waldschmidt | 313/566 |
| 2,793,282 | 5/1957 | Steigerwald | 219/69 R |
| 2,942,098 | 6/1960 | Smith, Jr. | 219/121 EG |
| 3,041,672 | 7/1962 | Lyle | 264/10 |
| 3,219,453 | 11/1965 | Gruber et al. | 219/121 EF |
| 3,275,787 | 9/1966 | Newberry | 264/10 |
| 3,328,672 | 6/1967 | Park | 219/121 EF |
| 3,432,335 | 3/1969 | Schiller et al. | 219/121 EE |
| 3,607,222 | 9/1971 | Kennedy | 219/121 EE |
| 3,634,647 | 1/1972 | Dale | 219/121 EE |
| 3,795,783 | 3/1974 | Plumat et al. | 219/121 EE |
| 3,864,572 | 2/1975 | van der Mast et al. | 250/423 F |
| 4,036,568 | 7/1977 | Morlet et al. | 264/10 |
| 4,190,404 | 2/1980 | Drs et al. | 425/8 |
| 4,207,040 | 6/1980 | Metcalfe et al. | 425/8 |
| 4,218,410 | 8/1980 | Stephan et al. | 264/10 |
| 4,264,641 | 4/1981 | Mahoney et al. | 264/10 |
| 4,318,029 | 3/1982 | Jergenson | 250/423 R |
| 4,374,075 | 2/1983 | Yolton et al. | 264/10 |
| 4,377,603 | 3/1983 | Itoh et al. | 427/25 |
| 4,431,137 | 2/1984 | Prewett et al. | 75/0.5 C |
| 4,474,604 | 10/1984 | Nakamura et al. | 75/0.5 B |
| 4,488,045 | 12/1984 | Anazawa et al. | 250/423 R |

FOREIGN PATENT DOCUMENTS

| | | | |
|---|---|---|---|
| 2107946 | 9/1972 | Fed. Rep. of Germany | 75/0.5 C |
| 57-74944 | 5/1982 | Japan | 250/423 R |
| 500904 | 4/1976 | U.S.S.R. | 75/0.5 C |

OTHER PUBLICATIONS

INSPEC, Patent Associated Literature, JO45-7513-G, "The Tungsten Filament Gun in the Scanning Electron Microscope", by Oatley, 12/1975.

Primary Examiner—Philip H. Leung
Assistant Examiner—Geoffrey S. Evans
Attorney, Agent, or Firm—Spensley Horn Jubas & Lubitz

[57] ABSTRACT

A process for producing ultrafine particles includes the steps of providing a consumable electrode having a rod or wire configuration, melting the tip of the electrode by means of electron bombardment, and applying an intense electric field to the molten tip to generate a beam of charged droplets. By heating the tip of the rod but avoiding melting of the tip and subsequently applying an electric field to the heated tip, an ion beam may be generated.

23 Claims, 3 Drawing Sheets

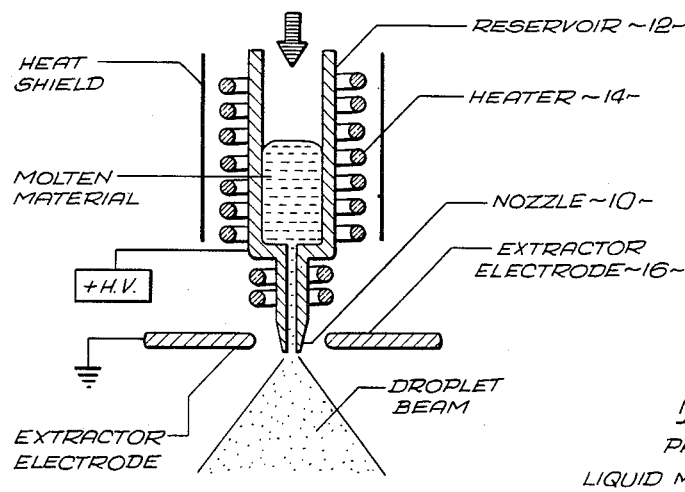
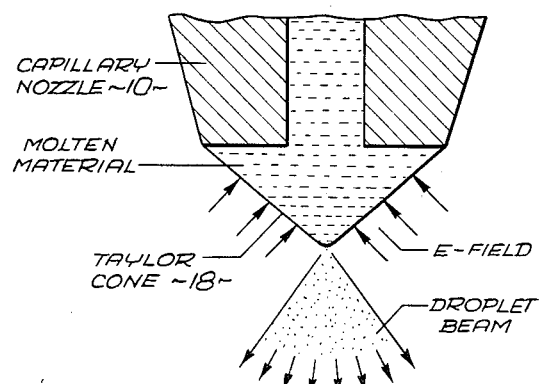
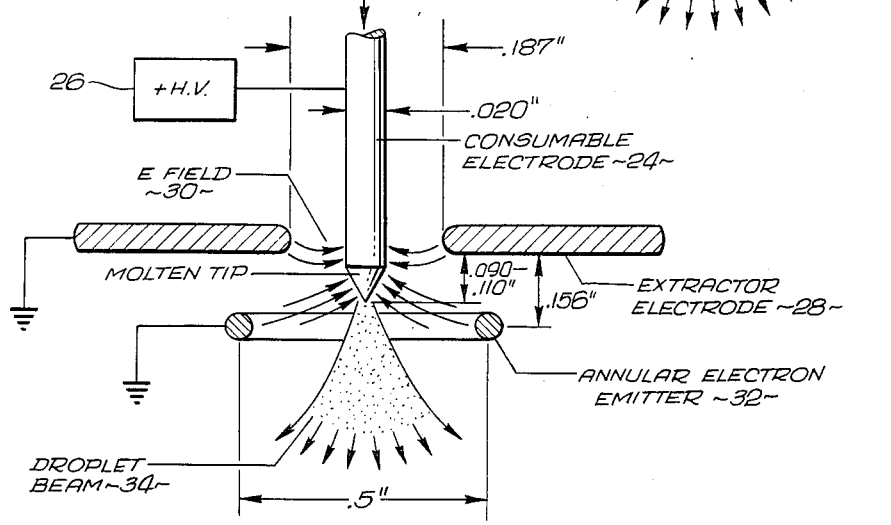

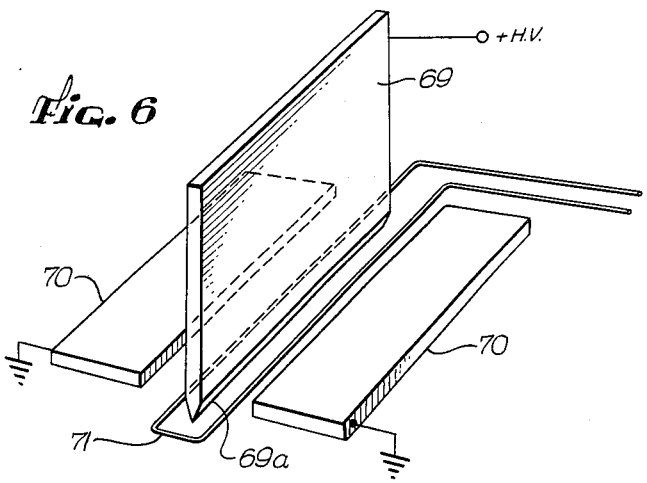
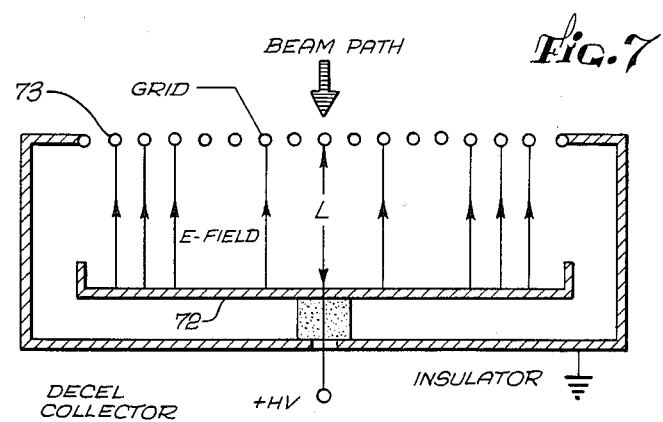
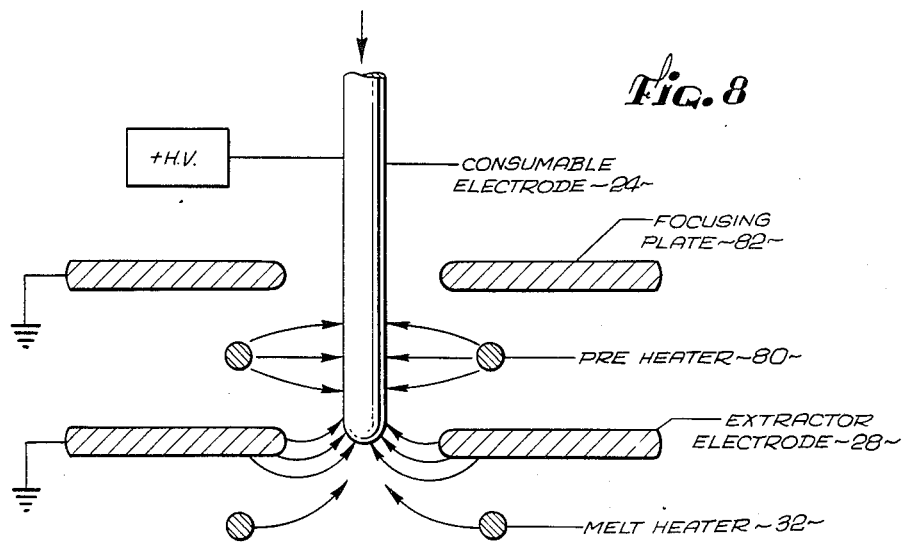

METHOD AND APPARATUS FOR MAKING SUBMICROM POWDERS

This is a continuation of application Ser. No. 577,073, filed Feb. 6, 1984 and now abandoned.

BACKGROUND OF THE INVENTION

1. Field of the Invention

The present invention relates to the formation of ultrafine particles of materials, and more particularly to the generation of micron and submicron particles by means of an electrohydrodynamic (EHD) process. The EHD process produces solid microspheres by solidification of molten droplets generated at a liquid surface stressed by intense electric fields.

2. Description of the Prior Art

At present there is no commercially available process for producing large quantities of micron and submicron powders from exotic alloys, high melting temperature materials such as Palladium, Tungsten or Molybdenum, and corrosive materials like uranium or titanium. Fine powder production using ultrasonic, centrifugal or gas atomization generally provides particulate material ranging from 10 to 100 microns in diameter. Although these methods are capable of producing commercial quantities of fine powders, they do not provide material with the ultrafine dimensions required of certain practical and research oriented applications. Other methods of producing fine powders are disclosed in U.S. Pat. Nos. 3,275,787 to Newberry, 3,975,184 to Akers, 3,963,812 to Schlienger, and 4,289,952 to Haggerty.

The uniqueness of the EHD process lies in its inherent capability for producing submicron spherical powders. Due to this feature, EHD technology has the potential of filling a significant void in the field of materials processing.

A prior art configuration employed to produce submicron particles by the EHD atomization process is illustrated in FIG. 1. Molten droplets are ejected from the tip of a nozzle 10 held at high potential. Small nozzle dimensions are required to achieve the high fields ($10^4$ to $10^5$ V/cm) needed to overcome the surface tension forces holding the liquid surface together. Using nozzles with overall tip diameters of 0.025 cm, applied voltage of 10 kV are typically required to initiate and sustain the dispersion process. The nozzle is attached to a reservoir 12 containing a supply of feedstock material. The feedstock material is melted by means of a resistive heater 14 enclosing the reservoir, and molten material is fed to the nozzle apex region by application of positive pressure or by surface tension forces. A grounded extractor electrode 16 is positioned near the nozzle and the application of a high voltage to the nozzle creates a high field at the nozzle tip which pulls the liquid meniscus into a stable geometry. This geometry is indicated at 18 in FIG. 2 and is referred to as a Taylor cone. The applied electric field is further intensified at the apex of the liquid cone. The amplified electrostatic stresses soon exceed the surface tension forces, thereby causing the material to be dispersed into a divergent beam of positively charged submicron droplets. As is the case with any atomization process, droplets are ejected with a distribution in size. The conditions favorable for submicron particle generation are low material flowrates and wettability of the molten material with the nozzle emitter.

The process described above is disclosed in U.S. Pat. No. 4,264,641 to Mahoney et al., the disclosure of which is incorporated herein by reference. This process, is well suited for producing samples used in scanning or transmission electron microscope analyses. However, it is limited to materials with low or intermediate melting points (typically less than 2000° C.) and production of powders in low quantities. Factors which limit the type of materials that can be reduced to submicron powder include wettability of molten material with source components, temperature limitations, crucible/nozzle corrosion and the inadequacies of resistive heating elements. Induction heating can be used to achieve high temperatures with a single source but it is difficult to integrate this heating method into a system using multiple powder generators. Furthermore, the power required by either resistive or inductive heating to maintain reservoir material in the molten state is excessive.

The present invention in one embodiment employs electron beam bombardment to heat a material which is to be atomized. Heating of materials in this fashion has been accomplished in the vacuum evaporation of metal films and films for high resolution shadowing of electron microscope specimens. These applications are discussed in J. Burden et al., "The Evaporation of Metals and Elemental Semiconductors Using a Work-Accelerated Electron Beam Source," Vacuum, 19 (1969) 397, and in Zingsheim et al., "Apparatus for Ultra-Shadowing of Freeze Etched Electron Microscope Specimens," J. Phys. E: Sci. Instrum., 3 (1970) 39. Electron bombardment heating has been used to heat an emitted tip of an EHD ion source, as described in T. Noda et al., "An Electrohydrodynamic Ion Source with a Reservoir and an Emitter Tip Heated by Electron Bombardment," Int. J. Mass Spectrometry and Ion Phys. 46 (1983) 15. This heating method has also been employed for nozzle heating in the prior art EHD process for forming submicron particles described above.

SUMMARY OF THE INVENTION

The present invention is directed to an EHD atomization process in which the reservoir/nozzle arrangement of the prior art is replaced with a consumable electrode such as small diameter feedstock wire or rod. In operation, the end of the rod is melted to form a molten tip. In the preferred embodiment, the melting is accomplished by means of a thermionic electron emitter, which bombards the tip of the rod with electrons. On impact with the rod, the kinetic energy of the electrons is released as heat energy. Heating may also be accomplished with other methods, such as by the use of a focused laser beam or by an electron beam using conventional electron gun configurations. The rod is maintained at a high voltage in a manner similar to the maintenance of a high voltage of the nozzle in prior art processes. A grounded extractor electrode is located near the tip of the rod, and an intense electric field is created at the tip of the rod. Depending upon the location of the wire tip, the annular electron emitting filament may also serve as an extraction electrode. Once the tip has melted, the electrostatic stresses acting on the molten rod tip will disrupt the liquid surface, producing a beam of microparticles. For continuous operation and also to ensure that the end of the rod remains in the same location relative to the extractor electrode during powder generation, a rod feed mechanism is provided to replace material removed during the atomization process.

The present invention has several substantial advantages over prior art EHD processes. Since the molten material is in contact with the solid phase of the same material, no reservoir or crucible is required. This also has the advantage of eliminating contamination of the submicron droplet beam by reservoir or nozzle materials. Since no reservoir is required, materials can be processed which do not easily wet dissimilar materials. Since the process requires that only a small quantity of the material be in the molten state, the ends of the fine rods can be melted using low power. The thermal energy input is highly concentrated at the apex of the molten surface and is sufficient to overcome the capacity of the rod to remove heat by conduction. Compared with prior art EHD methods, the proposed technique has the potential to produce commercial quantities of submicron powders by fabrication of linear array modules. The packing density of the configuration is not limited by the bulky structures associated with reservoirs, heat shielding, large heater assemblies, etc. In addition, longer lifetime is achieved since the process is not limited by corrosion or nozzle plugging.

The relatively high production capabilities of the present invention substantially increase the application possibilities for submicron powders. Commercial quantity submicron powder generation can significantly impact microelectronic fabrication methods, rapid solidification technology, catalytic processes, film processing and many other areas. In addition, the present invention may have a substantial impact in the field of sintering since powders produced in accordance with the inventive process closely approximate the requirements for the ideal sinterable powder. The elimination of the reservoir and nozzle and resultant ability to process materials with melting temperatures much greater than previously possible (including materials with melting temperatures in excess of 3000° C.) substantially increases the number of different materials from which submicron particles can be formed.

BRIEF DESCRIPTION OF THE DRAWINGS

The invention will now be described with reference to the accompanying drawings, wherein:

FIG. 1 is a block diagram of a prior art EHD apparatus;

FIG. 2 is a sectional view of the nozzle of the apparatus of FIG. 1 and a molten cone formed at the nozzle tip 1;

FIG. 3 is a diagram showing the basic concept for producing submicron powders in accordance with the present invention;

FIG. 6 is a perspective view of a consumable electrode in sheet form which may be used for volume production of microparticles;

FIG. 7 is a plan view in section of a microparticle deceleration collector;

FIG. 8 is a diagram showing a powder production system including a preheater element.

DESCRIPTION OF THE PREFERRED EMBODIMENT

Figure 4:
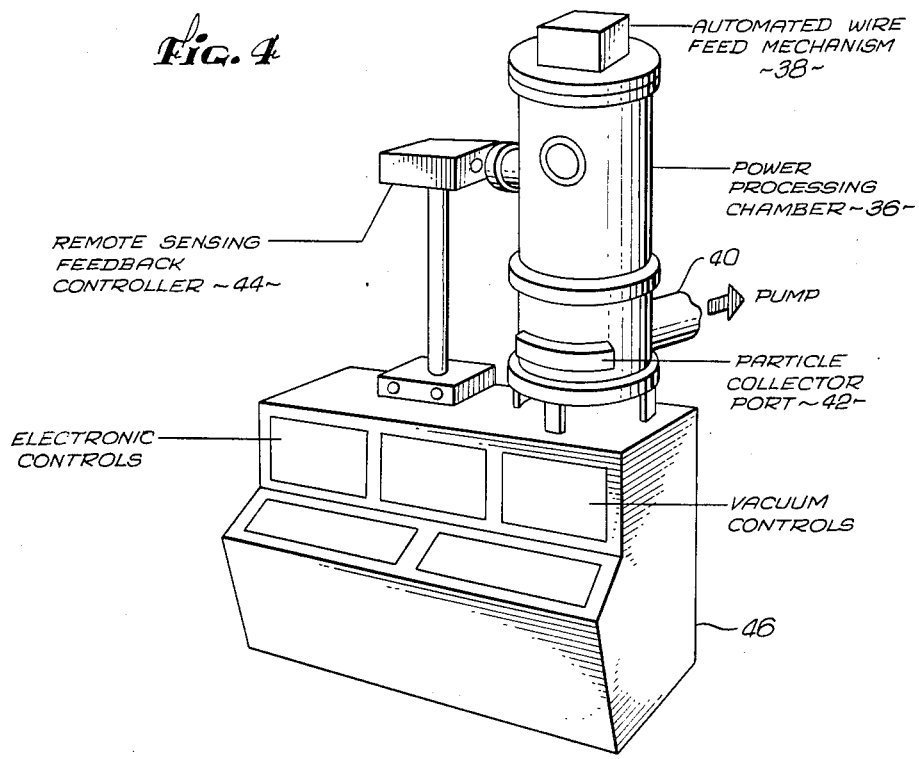
FIG. 4 is a perspective view of a processing apparatus in accordance with the present invention.

The following description is of the best presently contemplated mode of carrying out the invention. This description is made for the purpose of illustrating the general principles of the invention and is not to be taken in a limiting sense. The scope of the invention is best determined by reference to the appended claims.

Referring to FIG. 3, the process of the present invention employs a consumable electrode 24 to form micron or submicron sized particles. The electrode 24 is in the form of a rod or wire, and the term "rod" as used herein shall be construed to include a flexible wire. In the present embodiment of the invention, the rod 24 has a diameter on the order of 0.020 inches to 0.125 inches, although the actual rod dimensions will depend upon the rod material as well as other factors. Rods having dimensions outside of these limits may well be suitable. The rod may be formed of many different materials which may be molten and acted upon by an electric field to generate a beam of microparticles, such materials including but not limited to various metals, alloys, semiconductors, oxides, ceramics and ceramic/metallic combinations. One basic requirement is that the material be able to be supplied in a suitable configuration, which in the preferred embodiment is a rod, wire or sheet form.

A high voltage from a source 26 (which in the preferred embodiment is a power supply operated in a current regulated mode) is applied to the rod 24 and a a grounded extractor electrode 28 is positioned near the tip of the rod. As a result of this configuration, an intense electric field 30 is created in the vicinity of the rod tip. A grounded annular electron emitter 32, which in the present embodiment of the invention is a tantalum filament, is positioned below the extractor electrode 28 near the tip of the rod 24. Heating current is passed through the emitter 32 and the emitter provides thermionically emitted electrons which are accelerated through the potential difference provided by the high voltage rod and emitter 32 or grounded extractor electrode 28. The rod, maintained at high voltage, becomes a work-accelerated electron beam heated source. Electron beam focusing is accomplished by the geometry of the heated workpiece (rod) which establishes an intense converging field at the rod tip. Upon impact with the rod, the kinetic energy of the electrons is released as heat energy. Only the tip of the rod 24 is melted, with the remainder maintaining its solid state.

Once the tip of the rod has melted, the electrostatic stresses acting on the molten rod tip will form the tip into a conical configuration and will overcome the surface tension of the tip, thus causing a beam 34 of positively charged droplet microparticles to be generated. The droplets are allowed to solidify and are collected in a collector (not shown) located in the path of the beam. Alternatively, an article may be coated by placing it in the path of the beam 34 so that it will be struck by the molten droplets.

For continuous operation and also to ensure that the end of the rod remains in the same location relative to the extractor electrode during powder generation, a rod feed mechanism must be provided to replace material removed during the atomization process. The material may be provided by a spool and fed by an appropriate drive mechanisms.

Tests with a device similar to that shown in FIG. 3 have produced molybdenum powders from a 0.060-inch diameter rod using 17–24 watts of input power to the electron beam heater and 22–40 watts power input to the rod tip. Many different physical configurations can be employed, and the power requirements will depend both upon the material being atomized and the physical relationship between the elements of the system. FIG. 3 shows illustrative dimensional relationships between electrostatically active components of the consumable electrode apparatus found through experimentation to produce stable emissions of fine particles using a stainless steel electrode. Stable emissions of droplets have been achieved using rods with their tips positioned above the extractor electrode to positions extending down to and below the heating filament.

The atomization process is carried out in a vacuum chamber. FIG. 4 illustrates a suitable apparatus for producing powders in accordance with the present invention. The device includes a powder processing vacuum chamber 36 having an automated wire feed mechanism 38 secured to its top cover, a vacuum pump port 40 and a particle collector port 42 containing a particle collector tray. If the process is to be used for coating a workpiece, the workpiece is carried in the collector tray. A remote sensing feedback controller 44 is provided to control the wire feed mechanism 38. The chamber 36 and controller 44 are supported on a control console 46 containing vacuum controls and electronic controls.

Figure 5:
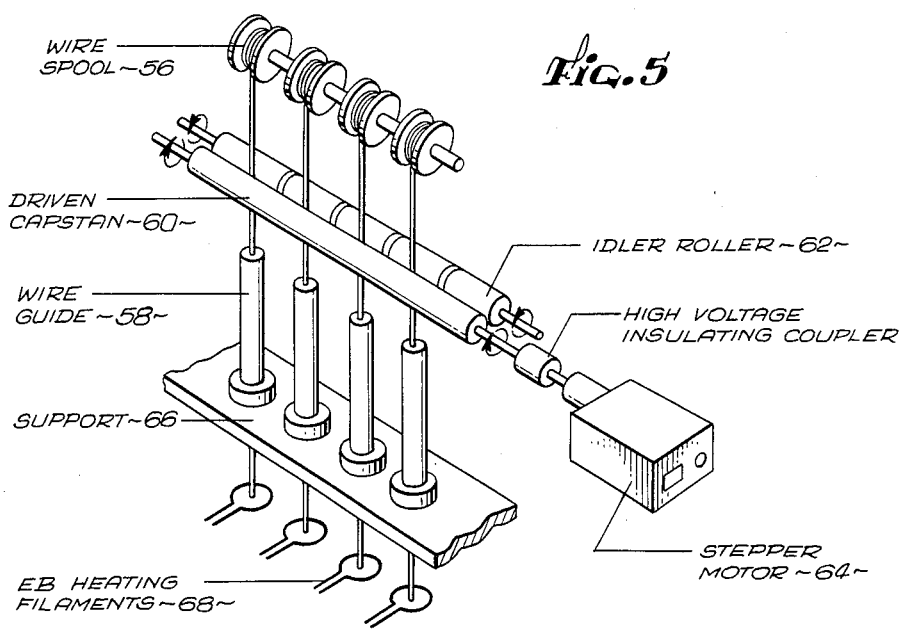
FIG. 5 is a diagrammatic perspective view of an automated wire feed concept for a multiple rod system.

In order to achieve relatively high volume production, a multiple rod module as illustrated in FIG. 5 may be employed. Wire is provided from a plurality of wire spools 56 and driven through wire guides 58 by means of a capstan 60 and idler roller 62. The capstan 60 is driven by means of a stepper motor 64. The wire guides 58 are connected to a common support 66, and in the arrangement shown in FIG. 6, separate annular electron beam heating filaments 68 are employed.

As an alternative to the use of plural rods, a consumable electrode in the form of a sheet 69 as shown in FIG. 6 may be provided. By appropriately heating the lower edge 69a of the sheet and applying an intense electric field to the edge, a plurality of Taylor cones will be formed along the length of the edge, thus resulting in the production of plural beams of droplets. The thickness of the sheet should be similar to the diameter of the rod electrodes. In FIG. 6, an elongated and slotted grounded extractor electrode 70 is employed as is an elongated heating filament 71.

Once electrostatic conditions are established for generation of ultrafine particles, the next step is to determine the minimal time required for the molten particles to solidify. Knowing the particle velocity, the transit distance required for collection of the particles in a solidified condition can be determined. This parameter is useful for designing the overall processing chamber length necessary for solid particle collection without employing auxiliary electrostatic deceleration methods. The time for solidification and thus distance required may be calculated or determined experimentally. Sufficient distance should be provided to enable the microparticles to solidify and also to prevent the microparticles from heating sufficiently to remelt them when they impact the collector.

In order to reduce the distance necessary to enable the microparticles to solidify, a deceleration collector as illustrated in FIG. 7 may be provided. A collector tray 72 is maintained at a high voltage, with a grounded collector grid 73 being spaced above the tray 72 within the beam path of the microparticles. When the positively charged particles pass through the grid, they will experience an electric force determined by the deceleration collector tray voltage and the distance L separating the grid from the collector tray. This force opposes the initial motion of the charged particles, thereby decelerating the particles and reducing the distance necessary to provide sufficient time for the particles to solidify.

Referring to FIG. 8, the input requirements from the electron filament heater to melt the tip of the rod may be reduced by the use of an additional electron beam preheater filament 80. An additional electrode 82 is provided in addition to the extractor electrode 28 to focus the electrons to the area of the rod near the tip. The preheater filament 80 provides a thermal bias which reduces the energy input required to the melt filament 32, and is also expected to exert a stabilizing influence on the melt conditions by reducing the rate of heat conduction away from the rod tip. In this regard, concentrated preheating near the rod tip may be more effective than the application of even heating along an extended length of the rod shaft.

The process of the present invention may also be employed for ion generation rather than ultrafine particle generation. In order to accomplish such operation, the heating of the rod is controlled so that the tip of the rod remains below the melting point. The heating causes dopant or impurity atoms in the rod to migrate to the surface of the tip of the rod, where they are surface ionized. The intense electric field then pulls the ions away from the surface, thus generating an ion beam. Alternatively, ions may be generated from the major elements comprising the rod material itself (referred to as auto-ionization). It should be noted that when the process is employed to produce ultrafine particles, ions are also contained in the beam of particles. However, by heating the tip of the rod to a point below its melting point, a beam of ions alone can be formed. It should be noted that several materials may be simultaneously subjected to the process of the present invention by employing a laminated tubular or sheet structure, and the terms "rod" and "sheet" as used herein shall be construed to include multi-material configurations. For example, a metal rod encased in a ceramic tube may be used to produce a composite powder, or two metals may be processed to form an alloy.

The present invention may also be employed for reactive powder processing by introducing a reactive gas into the vacuum chamber 36 of FIG. 4 as submicron particles are generated. The particles will react with the gas to form compounds, thus further increasing the number and kinds of materials which may be produced. Examples of such processes include the reaction of silicon with nitrogen to form silicon nitride, molybdenum with nitrogen to form molybdenum nitride and iron with oxygen to form iron oxide.

Thus, the present invention provides a process and apparatus for producing ultrafine particles which does not require any reservoir and/or nozzle assembly. Since only a small quantity of material need be in the molten state, temperatures required to melt various materials can be easily achieved. The thermal energy input is highly concentrated, thereby significantly reducing power requirements. Powders can be formed on a large scale basis, and corrosion and nozzle plugging problems are eliminated.

What is claimed is:

1. A method of forming ultrafine particles comprising the steps of:
   providing a consumable rod of a material to be melted and formed into said particles, the rod having a diameter such that upon melting of the tip thereof the surface tension of the molten material will hold the molten tip against the unmelted portion of the rod;

melting the tip of the rod; and applying an electric field to the molten tip to create electrostatic forces which are high enough to overcome the surface tension of the molten tip to thereby generate a beam of ultrafine droplets of said material.

2. The method of claim 1 including the step of solidifying the droplets to form a powder of ultrafine particles.

3. The method of claim 1 including the steps of:
providing a workpiece having a surface to be coated; and
placing the surface of the workpiece in the path of the beam of droplets so that droplets will impinge upon the surface of the workpiece in their liquid state to thereby coat the surface of the workpiece.

4. The method of claim 1 wherein the step of melting the tip of the rod comprises the step of bombarding the tip of the rod with electrons.

5. The method of claim 1 wherein the electric field is maintained at a fixed location and including the step of feeding the rod of material as droplets are formed to maintain a desired positional relationship between the tip of the rod and the electric field.

6. The method of claim 1 wherein the steps of applying an electric field includes the steps of applying a positive voltage to the rod and providing a grounded extractor electrode near the tip of the rod.

7. The method of claim 1 including the step of heating a portion of the rod adjacent the molten tip to minimize heat conduction away from the tip through the rod.

8. A method according to claim 1 wherein the rod has a diameter of less than about 0.125 inches.

9. A method according to claim 1 wherein the rod has a diameter between about 0.02 inches and about 0.125 inches.

10. A method according to claim 1 wherein the method is carried out in a vacuum chamber.

11. A method according to claim 10 including the step of introducing a reactive gas into the vacuum chamber during the production of ultrafine particles, whereby said gas will react with the particles to form a desired material.

12. A method according to claim 1 wherein said rod of material is formed of plural distinct materials to be processed.

13. A method of forming ultrafine particles comprising the steps of:
providing a sheet of a material to be melted and formed into said particles, the sheet having a thickness such that upon melting a lower edge of the sheet the surface tension of the molten material will hold the molten edge against the unmelted portion of the sheet;
melting a lower edge of the sheet; and
applying an electric field to the molten edge to create electrostatic forces which are high enough to form the molten material into a plurality of cones and overcome the surface tension of the molten cones to thereby generate beams of ultrafine droplets of said material.

14. An apparatus for producing ultrafine particles of material, comprising:
means for supplying a solid piece of material from which particles are to be formed;
means for heating the material to melt a small portion thereof, said molten portion remaining attached to the remainder of the piece of material by surface tension; and
means for applying an electric field to the molten portion high enough to form the molten portion into a conical configuration and high enough to overcome the surface tension of the molten portion to thereby generate a beam of ultrafine droplets of said material.

15. An apparatus as in claim 14 wherein the means for heating includes an electron source for bombarding the portion of the material to be melted with electrons.

16. An apparatus according to claim 15 wherein the piece of material comprises a rod having a tip and the means for bombarding includes an annular electron emitter located near said tip.

17. An apparatus according to claim 15 wherein the electron emitter is a tantalum filament.

18. An apparatus according to claim 14 wherein the means for applying the electric field includes supply means for applying a high voltage to the piece of material and a grounded extractor electrode located near the molten portion.

19. An apparatus according to claim 14 including collector means for collecting the droplets after they have solidified.

20. An apparatus according to claim 19 wherein the collector means includes means for decelerating the droplets prior to collection.

21. An apparatus according to claim 20 wherein the droplets produced are charged droplets and wherein the means for decelerating includes means for generating an electric field in opposition to the direction of motion of the droplets.

22. An apparatus for producing ultrafine particles of material, comprising:
means for feeding a rod of consumable workpiece material having a lower tip;
electron source means for bombarding the tip of the rod to melt the tip in a region of size such that the surface tension of the molten material holds the molten material against the unmelted portion of the workpiece; and
means for applying an electric field to the molten tip high enough to form a Taylor cone from the molten material and to overcome the surface tension of the cone to thereby generate a beam of ultrafine droplets of said material, said means including a grounded extractor electrode near the tip of the rod and a power supply for applying a high voltage to the rod.

23. An apparatus according to claim 22 wherein the power supply is operated in a current regulated mode.

* * * * *